United States Patent [19]

Takahashi et al.

[11] Patent Number: 5,093,314
[45] Date of Patent: Mar. 3, 1992

[54] SUPERCONDUCTING WIRE AND METHOD OF MANUFACTURING THE SAME

[75] Inventors: Ken Takahashi, Ibaraki; Yukio Takeda, Hadano; Takeo Yamazaki; Tadahiko Miyoshi, both of Hitachi; Atsuko Soeta, Mito; Kunihiro Maeda, Hitachi; Takaaki Suzuki, Mito; Kie Nakamura, Sapporo; Choushiro Kitazawa, Hitachi; Masatoshi Nakazawa, Ibaraki, all of Japan

[73] Assignee: Hitachi, Ltd., Tokyo, Japan

[21] Appl. No.: 211,041

[22] Filed: Jun. 24, 1987

[51] Int. Cl.$^5$ ............................................. B32B 9/00
[52] U.S. Cl. .................................... 505/1; 505/701; 505/702; 505/703; 505/704; 428/323; 428/688; 428/930
[58] Field of Search ................ 505/1, 700–704; 29/599; 428/688, 930, 323

[56] References Cited

U.S. PATENT DOCUMENTS 4,826,808  5/1989  Yurek et al. .......................... 505/1

OTHER PUBLICATIONS

High Tc Superconductors-Composite Wire Fabrication, Jin et al. 5/87.

Primary Examiner—Patrick J. Ryan
Attorney, Agent, or Firm—Antonelli, Terry Stout & Kraus

[57] ABSTRACT

A superconducting oxide wire and a method of manufacturing the same are disclosed. The wire comprises a pipe made of a metal and a superconducting oxide material filling the interior of the pipe and comprising superconducting oxide grains which are bonded to each other and which have a perovskite crystal structure having a C face and a C axis. The superconducting oxide grains contain more than 50 vol % of plate-shaped grains of which the length in the direction of the C face is greater than the length in the direction of the C axis. The C faces of most the plate-shaped grains are arranged to be directed toward longitudinal axis of the pipe.

11 Claims, 6 Drawing Sheets

1 : Cu
2 : Ba
3 : Y
4 : O
5 : O (10% OF THE POSITIONS ARE NOT OCCUPIED BY OXYGEN)

SUPERCONDUCTING WIRE AND METHOD OF MANUFACTURING THE SAME

BACKGROUND OF THE INVENTION

The present invention relates to a superconducting wire and a method of manufacturing the same and, more particularly, to a superconducting wire which exhibits an enhanced critical current density and a method of manufacturing the same.

Intermetallic compounds such as $Nb_3Sn$ and $Nb_3Ge$ are known as superconducting materials and are put into practical use. However, the critical temperature (Tc) at which the superconductive state of these intermetallic compounds is attained is, for example, 23° K even in the case of $Nb_3Ge$ which has the highest Tc among the intermetallic compounds of the above-mentioned type. This has made it necessary for them to be cooled by means of liquid helium.

In 1987, it was found that oxides expressed as $YBa_2Cu_3O_{7-\delta}$ possess a Tc about 90° K which is tremendously higher in comparison with those of the intermetallic compounds conventionally known as superconductive materials. Since the Tc of such superconducting oxide materials is much higher than the boiling point (77° K) of liquid nitrogen, they can be cooled by means of inexpensive liquid nitrogen, thus making it unnecessary to use very expensive liquid helium.

Because the conventionally known superconducting materials are metals, they can be formed into wires relatively easily by, for instance, wire drawing. In contrast, because superconducting oxide materials are ceramics, they possess poor levels of ductility, thus making it very difficult to form them into wires. To cope with this problem, a wire-forming method has been devised and was reported in the MRS Spring Meeting, 1987 (pages 219-221). This method comprises filling a pipe with a superconducting oxide powder, drawing the resultant body, and, thereafter, subjecting the drawn body to heat treatment. With this method, however, since a powder is charged into a pipe in order to allow the superconducting oxide material to be formed into a wire, the areas of contact between particles forming the superconductive powder are small. Thus, a high critical current density Jc cannot be achieved. In addition, because the particles of a superconducting oxide material have a perovskide layer structure, current flows therein anisotropically. The reported method gives no consideration to this ansisotropy. As a result, depending upon the orientation in which the bonding of the particles occurs, the level of current flowing therein is apt to be reduced with the result that it has been impossible to obtain a high Jc.

SUMMARY OF THE INVENTION

An object of the present invention is to provide a superconducting oxide wire capable of exhibiting an enhanced critical current density.

Another object of the present invention is to provide a method of manufacturing a superconducting oxide wire capable of exhibiting an enhanced critical current density.

A superconducting oxide wire of the invention comprises: a pipe made of a metal extending in the direction of the longitudinal axis thereof; and a superconducting oxide material filling the interior of the pipe and comprising superconducting oxide grains which are bonded to each other and which have a perovskite crystal structure having C face and C axis, the superconducting oxide grains containing more than 50 vol% of plate-shaped grains of which a length in the direction of the C face is greater than another length in the direction of the C axis, the C faces of most of the plate-shaped grains being directed toward the longitudinal axis of the pipe.

A plate-shaped grain as specified herein is a grain having a perovskite crystal structure and having a length in the direction of the C face greater than another length in the direction of the C axis.

A method of the invention for manufacturing a superconducting oxide wire comprises the steps of: preparing a pipe made of a metal extending in the direction of the longitudinal axis thereof; preparing a powder of a superconducting oxide material which contains superconducting oxide particles having a perovskite crystal structure having C face and C axis and which contains more than 50 vol% of plate-shaped particles of which a length in the direction of the C face is greater than another length in the direction of the C axis; filling the pipe with the powder so as to prepare a composite conductive body; forming the composite conductive body into a wire by subjecting the composite conductive body to wire forming working and/or rolling in the direction of the longitudinal axis so that the C faces of most of the plate-shaped particles are directed toward the longitudinal axis of the pipe; and subjecting the thus formed composite conductive body to heat treatment so as to sinter the superconducting oxide material.

The composite conductive body may be prepared either by filling the interior of a metal pipe with a superconducting oxide material containing plate-shaped particles, or by subjecting raw material powders, which are to be converted to a superconducting material and which fill a metal pipe, to a heat treatment to generate plate-shaped superconducting oxide material. In the latter case, during a period of time in which the plate-shaped particles of a superconducting oxide are being generated by heat treatment, the body may be formed into a wire by wire drawing and/or rolling so as to direct most of the plate-shaped particles toward the longitudinal axis of the pipe. The metal pipe may have a plurality of through holes provided in its wall so as to enable a sufficient supply of oxygen during the sintering of the plate-shaped particles.

The superconducting oxide material is a product comprising: Cu; at least one element selected from the group consisting of Ba, Sr and Ca, at least one element selected from the group consisting of Y and rare earth elements; and O, or alternatively is a product comprising Cu; at least one element selected from the group consisting of Ba, Sr and Ca; at least one element selected from the group consisting of rare earth elements and Y; at least one element elected from the group consisting of alkali metals, bismuth and thallium; and O. Preferably, the superconducting oxide material of the superconducting wire may contain 60 vol% or more of plate-shaped particles of which the length in the direction of the C face is two or more times of the length in the C axis and the C faces of most of which plate-shaped particles are directed toward the longitudinal axis of the wire.

A high-temperature superconducting oxide material, such as a composite of barium, yttrium, and copper oxides, has a layer crystal structure based on the perovskite structure. Within a crystal, therefore, electrons can flow with ease in the direction of the layer. In addition, because of the layer crystal structure, if, during the growth of crystal particles, they are subjected to heat treatment under suitable conditions, and if they are then pulverized for a suitable period, the crystal particles are able to become plate-shaped. In a plate-shaped particle, electrons flows more easily in the direction of the C face than in the direction of the C axis which is normal to the C face. Therefore, the formation of such a material into a wire is effected in such a manner that plate-shaped grains have a preferred orientation in which the C faces of the grains are directed toward the longitudinal axis of the wire, thereby enhancing the critical current density of the superconducting wire. In contrast, in a condition where a material comprising plate-shaped particles simply fills a metal pipe, or in a condition where raw material powders filling a metal pipe are simply subjected to heat treatment to generate superconducting plate-shaped particles, the resultant superconducting plate-shaped particles do not have any particular preferred orientation and are oriented in random directions. According to the present invention, during the formation of the composite conductive body into a wire, the particles in the body are also drawn in the direction of the longitudinal axis of the wire while they are being subjected to a compression force acting in a direction vertical to the longitudinal axis, with the result that the C faces of the plate-shaped superconducting particles are directed in the longitudinal axis of the wire.

The superconducting oxide material containing plate-shaped particles with their C faces being grown is prepared by suitably selecting the heat treatment (i.e. firing of raw materials) temperature, the heat treatment period, and/or the powdering period (i.e. the degree of powdering). Since a conventional method of preparing a powder for wire-formation gives no consideration to these conditions, conventional powder contains 80 vol% or more of particles in which the ratio of the length on the C face to the length on the C axis is less than 2 : 1. As a result, the areas of contact between particles of the superconducting powder within the wire are small, as described before. The results of these small areas and of the random direction in which the particles are bonded is that it is impossible to achieve a high Jc. In contrast, according to the present invention, a powder prepared for wire-formation contains particles having their C faces grown in such a manner that a length of the C face is two times or more of another length of the C axis, thereby enabling the achievement of a high Jc. The powder used in the present invention is fired (i.e. heat treated) under suitable conditions. The heat treatment temperature should be selected from a range of 900° C. to 1050° C. inclusive, preferably from 970° C. to 1025° C. inclusive. The heat treatment period is determined in dependence on the temperature used; if the temperature is high, the period may be short, whereas, if the temperature is low, a long period is necessary. If the heat treatment temperature is lower than 900° C., the growth of C faces needs an unpractically long period, whereas, if it is higher than 1050° C., the superconducting oxide phase changes into a different substance.

The plate-shaped superconducting oxide particles with their C faces being grown are subjected to wire-formation in the subsequent step. By the wire-formation, the particles are arranged to direct their C faces toward the direction of the axis of the wire. Even after the wire-formation, the grains maintains both the particular plate-like shape and the amount ratio of the plate-shaped particles that existed before the wire formation. This is considered to be a result of the facts that a superconducting oxide material has substantially no ductility, that the configuration of the plate-shaped particles is such that a length in the direction of the C face is greater than another length in the direction of the C axis normal to the C face, and that each of the plate-shaped particles has small dimensions which are about 10 to 60 μm.

In a superconducting material, current flows almost in the direction of the C faces alone because of the anisotropy of the crystal structure. It is considered that the wire in accordance with the present invention is capable of exhibiting a critical current density which is higher than that of a wire manufactured using a conventional powder, because the C faces, which are the conductive surfaces, are arranged to be oriented toward the direction in which current flows, and because the grains are bonded to each other toward the direction which facilitates the flow of current.

DESCRIPTION OF THE PREFERRED EMBODIMENTS

The preferred embodiments of the present invention will be described by way of examples hereinbelow.

EXAMPLE 1

Figure 1:
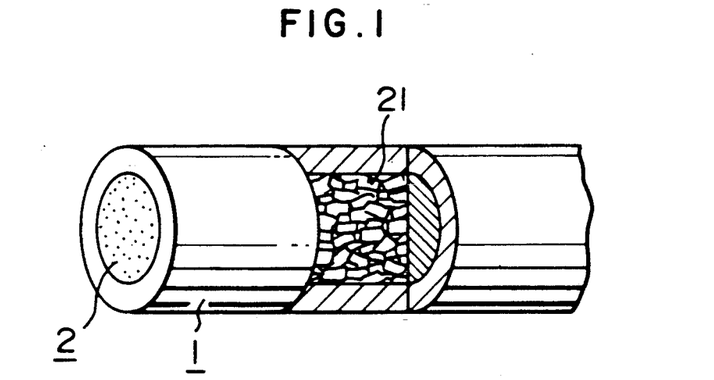
FIG. 1 is an enlarged partially broken perspective view of a superconducting oxide wire embodying the present invention, which shows the structure of the wire.

FIG. 1 shows the structure of a superconducting oxide wire in accordance with present invention. As shown in the figure, a copper pipe 1 having a small gauge has its interior filled with a superconducting material 2. In the superconducting material 2, plate-shaped grains 21 integrated each other are arranged in such a manner that their C faces are directed toward the longitudinal axis of the wire.

Figure 2:
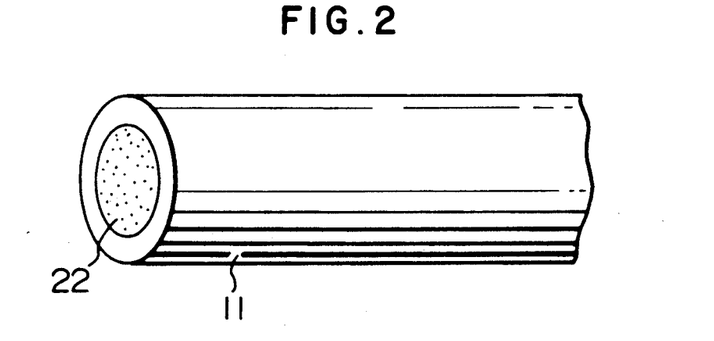
FIG. 2 is a perspective view of a composite conductive body prepared prior to the wire forming step in the method of the invention.

The superconducting wire was manufactured in the following manner. The interior of a copper pipe 11 having an outer diameter of 30 mm and an inner diameter of 20 mm was filled with a powder of a super-conductive material 22, as shown in FIG. 2. The powder of the superconducting material 22 was a powder of $Ba_{1.8}Y_{1.2}Cu_3O_{7-\delta}$ which was obtained by mixing powders of barium oxide (BaO), yttrium oxide ($Y_2O_3$), and copper oxide, and thereafter by subjecting the resultant mixture to heat treatment at a temperature of 950° C. for 5 hours. The configuration of the particles of the powder was observed, and, as a result, it was found that the powder was mainly formed by plate-shaped particles each having a diameter of 30 to 60 $\mu$m and a thickness of 10 to 30 $\mu$m. Subsequently, a composite conductive body comprising the copper pipe 11 and the superconducting material 22 filling the pipe 11 was formed into a small-gauge wire having a diameter of 1 mm by extrusion. Thereafter, the thus formed body was kept at a temperature of 950° C. in an atmosphere of Ar for 5 hours, thereby obtaining a superconducting wire A.

The resistance of the thus obtained superconducting wire A was measured, and it was found that the wire A had a critical temperature of 91° K. Further, the critical current density of the wire A was found to be 95 $A/cm^2$.

For the purpose of comparing the wire A with a comparison sample, a comparison wire B was prepared in the following manner. Predetermined amounts of raw material powders of the same types as those mentioned above were mixed and were then charged into a copper pipe having an outer diameter of 30 mm and an inner diameter of 20 mm. The copper pipe with the mixed powders was formed into a small-gauge wire having a diameter of 1 mm by extrusion. Thereafter, the thus formed wire was preliminarily maintained at a temperature of 950° C. in an Ar atmosphere for 5 hours and was then finally maintained at a temperature of 950° C. in an Ar atmosphere for 5 hours. The thus obtained comparison superconducting wire B had a critical temperature of 91° K which was the same as that of the superconducting wire A, but the wire B had a relatively lower critical current density of 50 $A/cm^2$. The superconducting material within the superconducting wire B was analyzed by means of X-ray diffraction, and, as a result, it was found that the material was formed of crystal grains expressed as $Ba_{1.8}Y_{1.2}Cu_3O_{7-\delta}$, similarly to the material within the wire A. The crystal grains were generally plate-shaped and had a diameter of 30 to 60 $\mu$m and a thickness of 10 to 30 $\mu$m.

Figure 3:
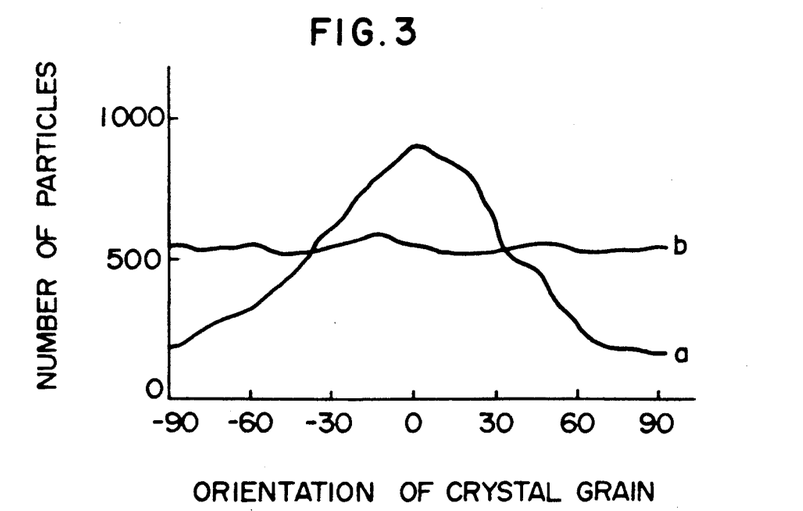
FIG. 3 is a graph showing the orientation distribution of crystal grains within a superconducting oxide wire manufactured by a method of the present invention.

In order to examine the orientation with which the crystal grains of each of the wires A and B were arranged, a section parallel to the longitudinal direction of each wire A or B was observed, and the orientation distribution of the crystal grains was measured by means of an image analyzer regarding each of the wires A and B. In this examination, the orientation of the crystal grains was expressed in terms of the angle between the longitudinal axis of each superconducting wire and an axis of each grain which axis is defined by two peripheral points spaced a maximum distance apart in the grain. FIG. 3 is a graph showing the results of this examination. In the graph, a curve a indicates the orientation of the grains in the first-described superconductive wire A which was manufactured by charging the superconducting material 22 having plate-shaped particles into the copper pipe 11 and thereafter by forming the resulting body into a small-gauge wire. On the other hand, a curve b indicates the orientation of the grains in the second superconducting wire B which was manufactured, for the purpose of comparison, by forming a small-gauged wire and thereafter by subjecting the formed wire to heat treatment to obtain a superconducting wire. As is clearly seen from the graph, the curve b indicates that the grains of the wire B were arranged with no particular orientation, whereas the curve a indicates that the orientation distribution of the grains of the wire A had an orientation directed toward the longitudinal axis of the superconducting wire A. From these results, it is considered that, with the wire A, the process of forming a small-gauge wire, which forming was conducted after the plate-shaped superconducting oxide particles had been charged, gave grains a preferred orientation directed toward the axis of the wire, and that this preferred orientation of the grains brought about an increase in the critical current density of the wire.

Example 2

Powders of barium oxide (BaO), yttrium oxide ($Y_2O_3$), and copper oxide (CuO) were mixed under the same condition as that used in Example 1, and the mixture was charged into a copper pipe having an outer diameter of 30 mm and an inner diameter of 20 mm. The pipe with the mixture was gradually wire-formed, while it was being subjected to heat treatment at a temperature of 950° C. in an Ar atmosphere, thereby forming the pipe into a small-gauge wire having a diameter of 1 mm, and thereby obtaining a composite conductive body. Thereafter, the resultant body was subjected to heat treatment at a temperature of 950° C. in an Ar atmosphere for 5 hours, thereby manufacturing a superconducting wire C. In addition, another superconducting wire D for comparison was manufactured by forming a copper pipe filled with the same three kinds of green powders as above into a small-gauge wire by extrusion, and, thereafter by subjecting the formed wire to heat treatment twice at a temperature of 950° C. in an Ar atmosphere for 5 hours.

Both of the thus manufactured superconducting wires C and D had a critical temperature of 93° K. The critical current density of the superconducting wire C was 105 A/cm², while that of the superconducting wire D was 58 A/cm2, thus showing that the wire C had a greater critical current density. The superconducting materials within the corresponding superconducting wires C and D were analyzed by means of X-ray diffraction, and, as a result, both of the materials were found to be formed of crystal grains of $Ba_2YCu_3O_{7-\delta}$. The size of the grains were such that their long axes were 30 to 60 μm and short axes were 10 to 30 μm. The orientation distribution of the crystal grains were measured by using an image analyzer. As a result, the following tendency was observed: while the grains of the superconducting wire D had no particular orientation, that is, no preferred orientation, this being the same as the case indicated by the curve b shown in FIG. 3, the grains of the superconducting wire C had an orientation directed toward the longitudinal axis of the wire, this being same as that indicated by the curve a.

As described above by way of Examples 1 and 2, the method of the present invention is capable of manufacturing a superconducting wire in which plate-shaped superconducting oxide grains have a particularly directed orientation whereby the direction of the grains in which electrons can easily flow are oriented toward the longitudinal axis of the wire. Thus, there was obtained the effect that the critical current density is increased to a level which is almost two times the level obtainable where the grains have no particularly directed orientation (i.e. no preferred orientation).

It will be clearly understood that this effect could be obtained in other superconducting materials containing plate-shaped grains whose faces enable an easy flow of current or in other cases where other metal pipes were used, that is, the achievement of the advantage is not limited to the above-described examples.

Further, by virtue of the use of the superconducting oxide material, the superconducting wire of the present invention is capable of exhibiting an enhanced critical current density.

Example 3

Figure 4A:
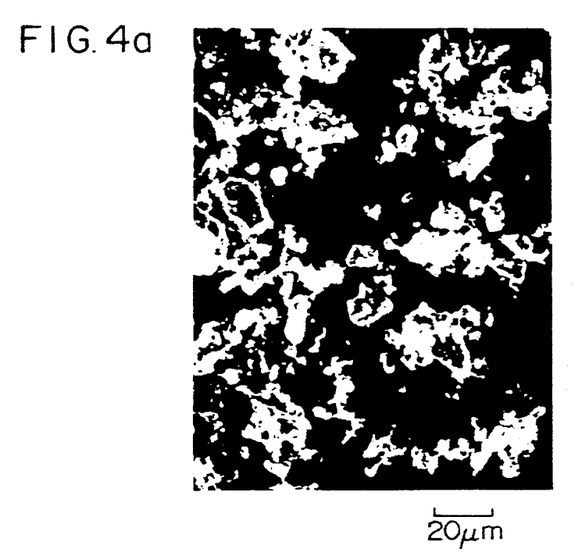
FIGS. 4a and 4b are photographs taken by a scanning electro-microscope (SEM), which show a powder of a superconducting oxide material that is used in the method of the present invention and that contains plate-shaped particles having their C faces grown in such a manner that a length in the direction of the C face is two times or more of another length in the direction of C axis.
Figure 4B:
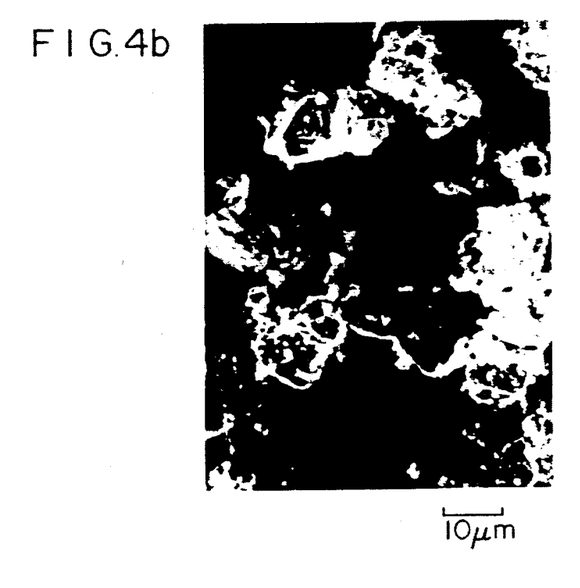
Figure 5:
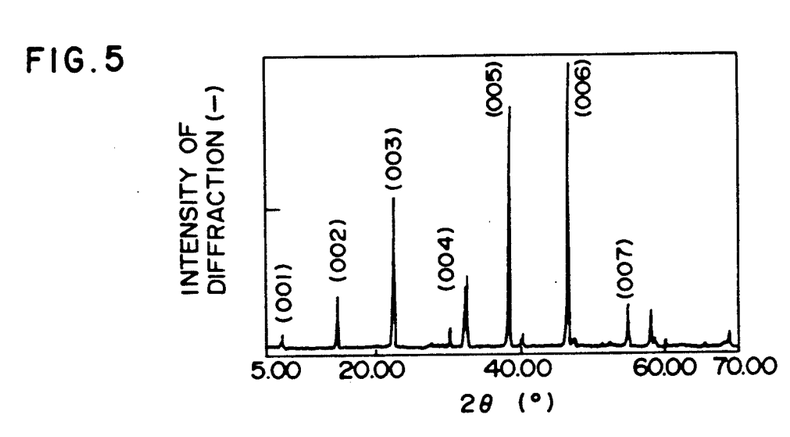
FIG. 5 is a graph showing the results obtained by examining the particles of the powder by means of X-ray diffraction.

20 g in total of commercially available powders of $Y_2O_3$, $BaCO_3$, and $CuO$ were weighed in such a manner that the mole ratio of Y, Ba and C was 1 : 2 : 3. The weighed powders were mixed for 1 hour, using a pulverizer made of agate. The powder of $Y_2O_3$ had a particle size of 2 to 3 μm, the powder of $BaCO_3$ had a particle size of 2 to 5 μm, and the powder of CuO had a particle size of 1, to 3 μm. Subsequently, the resultant powder mixture was twice subjected to a process in which it was preliminarily maintained at a temperature of 950° C. in an $O_2$ atmosphere for 5 hours, and a mass resulting from the preliminary heat treatments was subjected to pulverizing, thereby obtaining a powder for a superconducting oxide material. The powder was formed by a hydraulic press into a pellet having a diameter of 30 mm and a thickness of 1.0 mm. The pellet was maintained at a temperature of 975° C. in an $O_2$ atmosphere for 20 hours, to sufficiently grow the C faces. As a result, a mass containing 80 vol% or more of particles of which the length in the direction of C face was three or more times the length in the direction of the C axis, was obtained. The thus obtained mass was pulverized for 30 minutes in the pulverizer, thereby obtaining a superconducting powder of 200 mesh or less in which the C faces were grown in such a manner that the length in the direction of the C face was two or more times the length in the direction of the C axis. Photographs of the superconducting powder which were taken by an SEM are shown in FIGS. 4a and 4b. It was seen from the images produced by the SEM that in the powder the plate-shaped particles had a size of 10 to 60 μm. The amount of the plate-shaped particles was examined by means of an image analyzer, and it was found that plate-shaped particles of which the length in the direction of the C face was two or more time the length in the direction of the C axis were contained in the powder at a ratio of about 70 vol%. FIG. 5 shows the result of the analysis of the powder by means of the X-ray diffraction. From the results shown in FIG. 5, it was confirmed that the (00n) faces (n being an integer) were emphasized by high diffraction intensities, and the plate-shaped particles were particles having their C faces grown. Subsequently, the superconducting powder was charged into an Ag pipe having an inner diameter of 10 mm at a rate of about 2.7 g/cm³, thereby preparing a composite conductive body. The composite conductive body was subjected to the repetition of extrusion working in such a manner that in each repetition the working diameter was reduced by 0.1 mm until it became 3 mm and, after the diameter of the body had become 3 mm, the body was further reduced in diameter by 0.05 mm regarding each extrusion working, thereby forming the body into a small-gauge wire having an outer diameter of 1.2 mm and a thickness of the Ag pipe of about 0.1 mm. Further, the small-gauge wire was cold rolled, thereby obtaining a tape-shaped wire material having a thickness of 0.1 mm. The tape-shaped wire material was maintained at a temperature of 910° C. in an oxygen atmosphere for 5 hours and it was then gradually cooled to room temperature, thereby obtaining a superconducting wire. The critical current density Jc of the superconducting wire was measured at a temperature of 77° K without external magnetic field, and the Jc was found to be 4200 A/cm².

Figure 6:
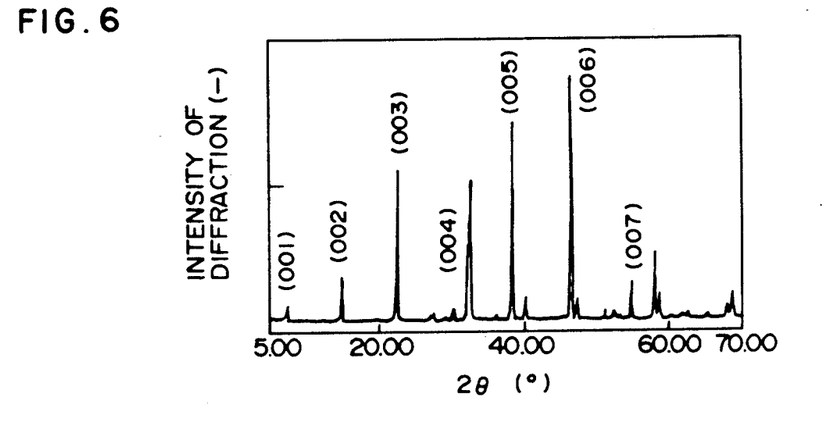
FIG. 6 is a graph showing the results obtained by examining the orientation of a resultant superconducting wire manufactured by charging the powder into an Ag pipe and by subjecting them to wire forming, the examination being performed by means of X-ray diffraction with respect to a face of the superconducting wire which face is parallel to the longitudinal direction of the wire.

Subsequently, the Ag pipe of the superconducting wire was removed, and the orientation of the faces of grains which existed within the superconducting wire in the direction of rolling was examined by means of X-ray diffraction. As a result, as shown in FIG. 6, the (00n) faces were emphasized by high diffraction intensities, and the grains had their C faces arranged toward the longitudinal axis of the wire. In other words, the grains had a particularly directed orientation, i.e., a preferred orientation. This is considered to result from the fact that a material which contained plate-shaped superconducting oxide particles in a large amount was used as the superconducting oxide material, the C faces were directed toward the longitudinal axis of the wire during the extrusion and rolling workings.

The reasons why the superconducting wire manufactured in Example 3 showed a much higher Jc than that of the wire A manufactured in Example 1 are considered to be the followings: a) the superconducting powder used in Example 3 contained about 70 vol% of plate-shaped particles of which the length in the direction of the C face was two times or more of the length in the direction of C the axis; b) since these plate-shaped particles had an extremely low ductility and a small dimension of 10 to 60 μm, the configuration and the amount of the plate-shaped particles that existed before the wire-formation were maintained even after the wire forming workings, and the C faces of these grains of the particular shape were arranged to be directed toward the longitudinal axis of the wire; and c) in Example 3, the sintering was conducted in an oxygen atmosphere.

Figure 7A:
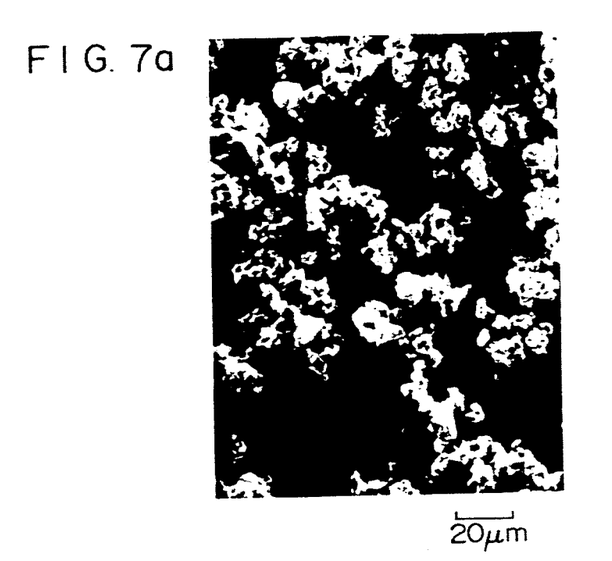
FIGS. 7a and 7b are photographs taken by an SEM, which show a comparison powder of a superconducting oxide material that is prepared for the purpose of comparing it with the powder used in the method of the present invention.
Figure 7B:
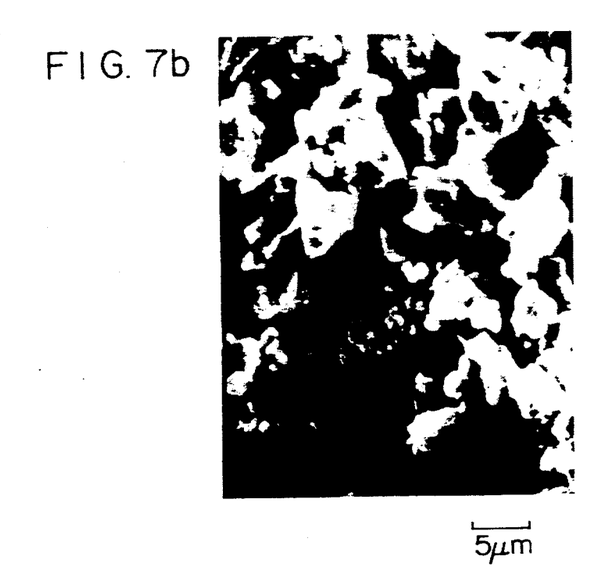
Figure 8:
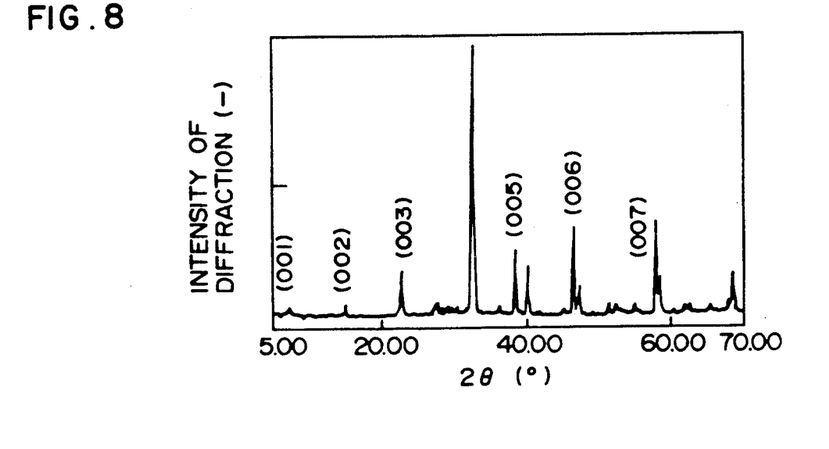
FIG. 8 is a graph showing the results obtained by examining the orientation of the particles of the comparison powder by means of X-ray diffraction.
Figure 9:
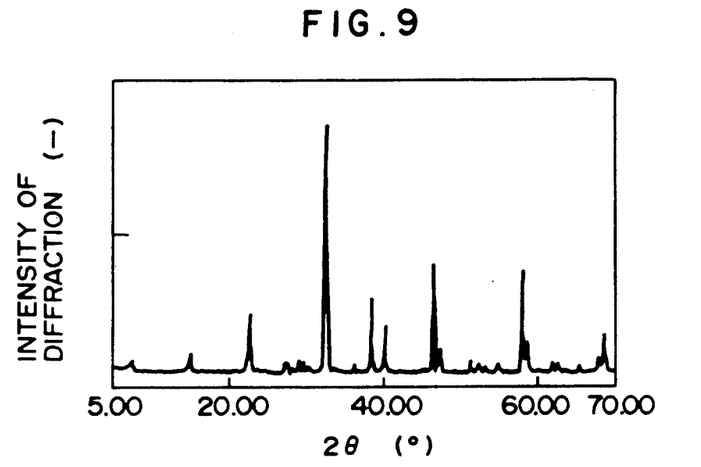
FIG. 9 is a graph showing the results obtained by examining the orientation of a comparison superconducting wire manufactured by charging the comparison powder of the superconducting material into an Ag pipe and by subjecting them to wire forming under the same conditions as those in the manufacture of the wire shown in FIG. 6, the examination being performed by means of X-ray diffraction with respect to a face of the comparison superconducting wire which face is parallel to the longitudinal direction of the wire.

For the purpose of providing a comparison sample for the superconducting material manufactured in this example, a comparison superconducting wire was manufactured in the following manner. A powder of a superconducting oxide material was prepared from a mixture of the same types as those used in Example 3 and under the same conditions as those used in Example 3 except that the preliminary heat treatment was conducted by using a temperature of 910° C. The thus prepared powder was formed into a pellet by the same operation as that in Example 3. The pellet was maintained at a temperature of 910° C. in an $O_2$ atmosphere for 5 hours, and the resultant mass was pulverized for 1 hour in the same pulverizer as in Example 3, thereby obtaining a comparison superconducting powder. FIGS. 7a and 7b show the photographs of the comparison powder which were taken by an SEM. It was seen from these SEM images that the comparison powder was formed of particles having particle sizes of 2 to 20 μm and that the particles had sizes and configurations which were much different from those of the powder shown in FIGS. 4a and 4b. FIG. 8 shows the results of the analysis of the comparison powder by means of X-ray diffraction. As shown in FIG. 8, in contrast with the results shown in FIG. 5, the (00n) faces were not emphasized. Subsequently, a tape-shaped superconducting wire was obtained from the comparison powder by the same operations as those in Example 3. The Jc of the tape-shaped superconducting wire was measured at a temperature of 77° K without external magnetic field, and the Jc was found to be 400 A/cmhu 2. Subsequently, an Ag pipe of the comparison superconducting wire was removed, and the orientation of the faces of grains which existed within the superconducting oxide material in the direction of the rolling was examined by means of X-ray diffraction. As shown in FIG. 9, the results of the X-ray diffraction analysis were different from those shown in FIG. 6 illustrating the results of the X-ray diffraction analysis of the superconducting material manufactured in Example 3.

EXAMPLE 4

Figure 10:
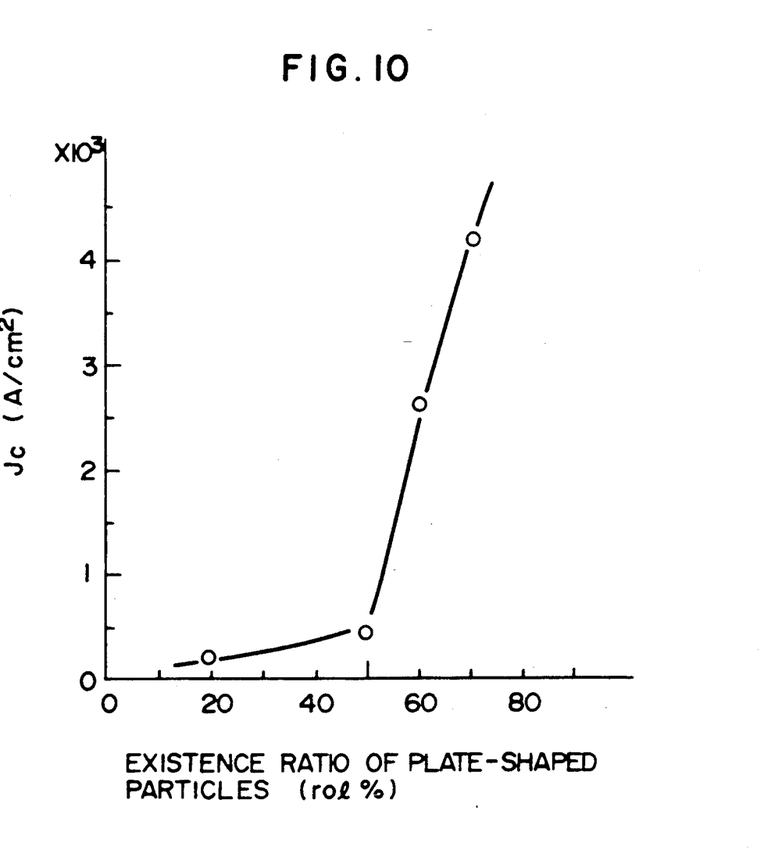
FIG. 10 is a graph showing the relationship between the amount of plate-shaped particles contained in a powder of a superconducting oxide material which is used to manufacture a superconducting wire, and the critical current density (Jc) of the superconducting wire comprising the powder.
Figure 11:
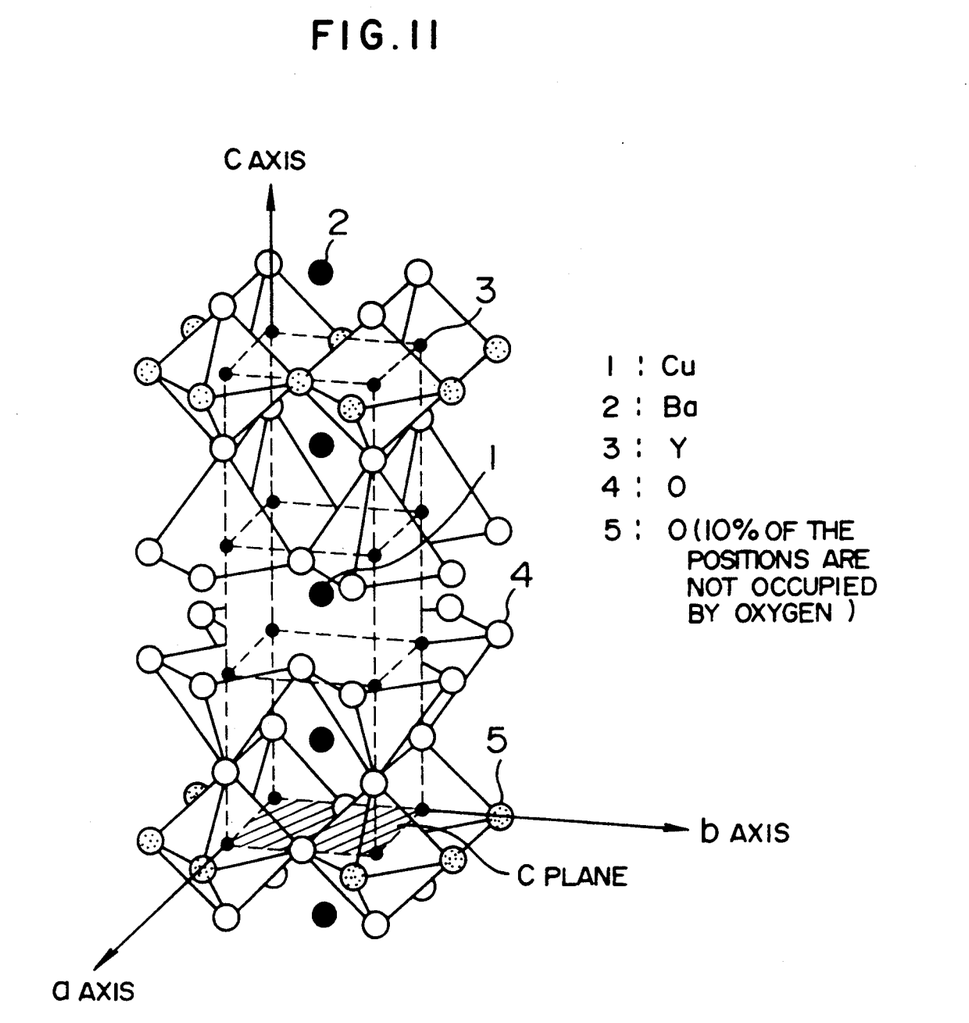
FIG. 11 is an illustration of a crystal structure of a superconducting oxide grain having a perovskite structure, which shows the C face and the C axis.

From a mixture of the same raw materials as those used in Example 3 and by the same operations as those in Example 3, a mass was obtained which contained 80 vol% or more of particles of which the length in the direction of the C face was three times or more of the length in the C axis. Subsequently, the mass was pulverized in various periods of time, thereby obtaining a plurality of powders having various amount ratios of plate-shaped particles. Tape-shaped superconducting wires were prepared by using these powders under the same conditions as those in Example 3. The Jc of each of the superconducting wires was measured at a temperature of 77° K without external magnetic field. The results of this measurement are shown in FIG. 10. It was found from these results that the Jc of a superconducting wire would be remarkably enhanced if the amount of plate-shaped particles exceeded 50 vol%, preferably, if the amount was 60 vol% or more. In the measurement, the amount of the plate-shaped particles was measured by analyzing, by means of an image analyzer, images of the powders of the superconducting oxide materials which images were obtained by an SEM.

EXAMPLE 5

2 l of a first aqueous solution was formed by adding 30.6 g of $Y(NO_2)_3.2H_2O$, 41.8 g of $Ba(NO_3)_2$, and 58.0 g of $Cu(NO_3)_2.3H_2O$ to the remaining water, and 1 l of a second solution was formed by adding 100 g of oxalic acid and 120 g of triethylamine to the remaining water. The second aqueous solution was dripped into the first aqueous solution by means of a micro-tube pump at a rate of 1 l/min and they were agitated. The resulting slurry was subjected to solid-liquid separation, to recover the solid substance. The thus obtained solid substance was dried at a temperature of 120° C., and it was then decomposed by being heated and maintained at a temperature of 400° C. for 3 hours. The resultant solid substance was finely pulverized, placed in an alumina crucible, and maintained at a temperature of 800° C. for 3 hours. The resultant solid substance was subjected three times to a process in which it was finely pulverized and was then maintained at a temperature of 900° C. for 3 hours, thereby obtaining a superconducting oxide powder. The superconducting powder was then formed by means of a hydraulic press into a pellet having a diameter of 30 mm and a thickness of 1.5 mm. The pellet was maintained at a temperature of 960° C. in an $O_2$ atmosphere for 15 hours, to sufficiently grow the C faces. As a result, a mass was obtained, that contained 60 vol% or more of plate-shaped superconducting oxide particles of which the length in the direction of the C face was four or more times the length in the direction of the C axis. The mass was pulverized in the same pulverizer as in Example 3 for 30 minutes, thereby preparing a superconducting oxide powder containing plate-shaped particles having a particle size of not more than 200 mesh, 60 vol% or more of which particles have a length in the direction of the C face which length is three or more times another length in the direction of C axis. Subsequently, the powder was charged, at a rate of 2.7 g/cm³, into an Ag mesh pipe which had an outer diameter of 15 mm, a length of 300 mm, and a wall thickness of 0.5 mm and which also had a plurality of through holes of a diameter of 0.1 mm formed in its wall, thereby obtaining a composite conductive body. The composite conductive body was subjected to extrusion working in each of which workings the diameter of the body was reduced by about 0.1 mm, thereby forming the body into a small-gauge wire having an outer diameter of 1 mm. The small-gauged wire was cold rolled so as to be formed into a tape-shaped wire material having a thickness of 0.2 mm. Subsequently, the tape-shaped wire material was maintained at a temperature of 910° C. in an oxygen atmosphere for 10 hours, and it was then gradually cooled to room temperature, thereby obtaining a superconducting oxide wire. The Jc of the thus obtained superconducting oxide wire was measured at the boiling temperature (77° K) of liquid nitrogen without external magnetic field, and the Jc was found to be 6600 A/cm².

EXAMPLE 6

Commercially available powders of $Bi_2O_3$, $SrCO_3$, $CaCO_3$, and CuO were weighed in such a manner that the mole ratio of Bi, Sr, Ca and Cu was 1 : 1 : 1 : 2. The powders of $SrCO_3$, $CaCO_3$ and CuO were first mixed by means of the same pulverizer as in Example 3 for 1 hour, thereby obtaining a mixture of these powders. The powder mixture was placed in an alumina crucible and was preliminarily maintained (i.e. heat treated) at a temperature of 950° C. in an atmospheric air for 42 hours. Thereafter, the $Bi_2O_3$ powder, which had been weighed, was added to the preliminarily heat-treated substance, and they were mixed by means of the pulverizer for 1 hour, thereby obtaining a powder. The powder was subjected twice to a process in which it was preliminarily maintained at a temperature of 820° C. in an atmospheric air for 12 hours and was then pulverized. The resultant powder was formed into a pellet having a diameter of 30 mm and a thickness of 1.0 mm. The pellet was maintained at a temperature of 880° C. in an atmospheric air for 48 hours, to sufficiently grow the C faces, thereby obtaining a superconducting oxide mass containing 80 vol% or more of plate-shaped particles of which the length in the direction of the C face was five or more times the length in the direction of the C axis. The thus obtained mass was pulverized by the pulverizer for 30 minutes, thereby obtaining a superconducting powder containing plate-shaped particles of not less than 80 vol% having their C faces grown in such a manner that the length in the direction of the C face was three times or more of the length in the direction of the C axis. The powder was charged into an Ag pipe having an inner diameter of 6 mm, thereby preparing a composite conductive body. The composite conductive body was subjected to wire formation so as to be formed into a small-gauge wire having an outer diameter of 1.2 mm. The small-gauge wire was cold rolled, thereby obtaining a tape-shaped wire material having a thickness of 0.1 mm. The tape-shaped wire material was maintained at a temperature of 910° C. in an oxygen atmosphere for 10 hours, and it was then cooled in a furnace to room temperature, thereby obtaining a superconducting wire. The Jc of this superconducting wire was measured at a temperature of 77° K without external magnetic field, and it was found to be 3800 A/cm$^2$.

EXAMPLE 7

Commercially available powders of $Y_2O_3$, $BaCO_3$, and CuO, which were of the same type as those used in Example 3, were weighed in such a manner that the mole ratio of Y, Ba and Cu was 1 : 2 : 3. A suitable amount of water was added to the powders, and they were mixed in a ball mill, thereby obtaining a uniform powder mixture. The powder mixture was heated to a temperature of 150° C., thereby removing the moisture by evaporation. The resultant substance was maintained at a temperature of 975° C. in an atmosphere of $O_2$ for 10 hours, to sufficiently grow the C faces. As a result, a mass of superconducting oxide material containing 70 vol% or more of particles of which the length in the direction of the C face was three or more times the length in the direction of the C axis. The mass was made into a powder having a particle size of 200 mesh or less, and the powder was charged into an Ag pipe having an inner diameter of at least 20 mm, under the same condition as that used in Example 3. After they had been subjected to extrusion, they were maintained at a temperature of 900° C. in an $O_2$ atmosphere for 5 hours. The critical current density of the resultant sample was measured at a temperature of 77° K without external magnetic field, and it was found that the Jc=3800 A/cm$^2$.

For the purpose of providing a comparison for the sample obtained in this example, a comparison sample was manufactured in the following manner. A mass in which the C faces were grown was produced by using the same material as those in Example 7 and the same method as that in Example 7. The mass was pulverized, thereby obtaining a comparison powder. In the pulverizing process, a longer pulverizing period was used so that the powder contained 70 vol% or more of particles of which the length in the direction of the C face was 1.5.or less times the length in the direction of the C axis. The comparison powder was charged into an Ag pipe, and they were subjected to wire formation and were then maintained at a temperature of 900° C. in an $O_2$ atmosphere for 5 hours. The critical current density of the thus obtained comparison sample was measured under the conditions of 77° K without external magnetic field, and the Jc=1200 A/cm$^2$.

EXAMPLE 8

Using starting materials of $Y(NO_3)_3.2H_2O$, $Ba(NO_3)_2$, and $Cu(NO_3)_2.3H_2O$ and the same method as that used in Example 5, a uniform powder mixture having fine particles was obtained. After the powder mixture had been dried, it was maintained at a temperature of 900° C. in an $O_2$ atmosphere for 15 hours, to sufficiently grow the C faces. As a result, a mass was obtained, that contained 60 vol% or more of particles of which the length in the direction of C face was four or more times the length in the direction of the C axis. The mass was made into a powder having a particle size of 200 mesh or less. The powder was charged into an Ag pipe having an inner diameter of 15 mm, and they were subjected to extrusion in the same manner as that in Example 5, thereby obtaining a superconducting wire corresponding to that of Example 5. The wire was subjected to heat treatment at a temperature of 930° C. in an $O_2$ atmosphere for 5 hours. The resulting sample had a critical temperature of 88° K, and a critical current density of 3500 A/cm$^2$ at 77° K.

As described above, according to the present invention, the superconducting oxide material constituting the superconducting oxide wire contains plate-shaped grains directed toward the axis of the wire (i.e. having a preferred orientation) whereby their C faces are arranged to be directed toward the longitudinal axis of the superconducting wire. Thus, the superconducting oxide wire is capable of exhibiting a high critical current density.

It will be clearly understood that this effect could be provided with another superconducting material containing plate-shaped grains whose faces enable an easy flow of current or with another metal pipe, and the achievement of the advantage is not limited to the above-described examples.

What is claimed is:

1. A superconducting oxide wire comprising:
   a pipe made of a metal extending in the direction of the longitudinal axis thereof; and
   a high Tc superconducting material filling the interior of said pipe and comprising superconducting oxide grains which are bonded to each other and which have a perovskite crystal structure having a C face and a C axis,
   said superconducting oxide grains containing more than 50 vol % of plate-shaped grains of which a length in the direction of the C face is greater than another length in the direction of the C axis,
   the C faces of a majority of the plate-shaped grains being directed in parallel with the longitudinal axis of the pipe, thereby facilitating current flow along said longitudinal axis.

2. A superconducting oxide wire comprising:
   a pipe made of a metal extending in the direction of the longitudinal axis thereof; and
   a high Tc superconducting material filling the interior of said pipe and comprising superconducting oxide grains which are bonded to each other and which have a perovskite crystal structure having a C face and a C axis, wherein said high Tc superconducting material is an oxide comprising: Cu; at least one element selected from the group consisting of Ba, Sr and Ca; at least one element selected from the group consisting of Y and rare earth elements; and O;

said superconducting oxide grains containing more than 50 vol % of plate-shaped grains of which a length in the direction of the C face is greater than another length in the direction of the C axis, the C faces of a majority of the plate-shaped grains being directed in parallel with the longitudinal axis of the pipe.

3. A superconducting oxide wire comprising:

a pipe made of a metal extending in the direction of the longitudinal axis thereof; and a high Tc superconducting material filling the interior of said pipe and comprising superconducting oxide grains which are bonded to each other and which have a perovskite crystal structure having a C face and a C axis, wherein said high Tc superconducting material is an oxide comprising: Cu; at least one element selected from the group consisting of Ba, Sr and Ca; at least one element selected from the group consisting of rare earth elements and Y; at least one element selected from the group consisting of alkali metals, bismuth, and thallium; and O;

said superconducting oxide grains containing more than 50 vol % of plate-shaped grains of which a length in the direction of the C face is greater than another length in the direction of the C axis, the C faces of a majority of the plate-shaped grains being directed in parallel with the longitudinal axis of the pipe.

4. A superconducting oxide wire comprising:

a pipe made of a metal extending in the direction of the longitudinal axis thereof; and a high Tc superconducting material filling the interior of said pipe and comprising superconducting oxide grains which are bonded to each other and which have a perovskite crystal structure having a C face and a C axis, wherein said high Tc superconducting material contains more than 50 vol % of plate-shaped grains of which the length in the direction of the C face is two times or more greater than the length in the direction of the c axis;

said superconducting oxide grains containing more than 50 vol % of plate-shaped grains of which a length in the direction of the C face is greater than another length in the direction of the C axis, the C faces of a majority of the plate-shaped grains being directed in parallel with the longitudinal axis of the pipe.

5. A superconducting oxide wire comprising:

a pipe made of a metal extending in the direction of the longitudinal axis thereof; and a high Tc superconducting material filling the interior of said pipe and comprising superconducting oxide grains which are bonded to each other and which have a perovskite crystal structure having a C face and a C axis, said superconducting oxide grains containing more than 50 vol % of plate-shaped grains of which a length in the direction of the C face is greater than another length in the direction of the C axis, the C faces of a majority of the plate-shaped grains being directed in parallel with the longitudinal axis of the pipe, thereby facilitating current flow along said longitudinal axis, wherein said wire has a critical current density of 90 A/cm$^2$ or more at the critical temperature.

6. A superconducting oxide wire comprising:

a pipe made of a metal extending in the direction of the longitudinal axis thereof; and a high Tc superconducting material filling the interior of said pipe and comprising superconducting oxide grains which are bonded to each other and which have a perovskite crystal structure having a C face and a C axis, said superconducting oxide grains containing more than 50 vol % of plate-shaped grains of which a length in the direction of the C face is greater than another length in the direction of the C axis, the C faces of a majority of the plate-shaped grains being directed in parallel with the longitudinal axis of the pipe, thereby facilitating current flow along said longitudinal axis, wherein said wire has a critical current density of 3500 to 6000 A/cm$^2$ at a temperature of 77° K which is the boiling point of liquid nitrogen.

7. A superconducting oxide wire comprising:

a pipe made of a metal extending in the direction of the longitudinal axis thereof; and a high Tc superconducting material filling the interior of said pipe and comprising superconducting oxide grains which are bonded to each other and which have a perovskite crystal structure having a C face and a C axis, said superconducting oxide grains containing more than 60 vol % or more of plate-shaped grains of which a length in the direction of the C face is two times greater than another length in the direction of the C axis;

the C faces of a majority of the plate-shaped grains being direction in parallel with the longitudinal axis of the pipe, thereby facilitating current flow along said longitudinal axis.

8. A superconducting oxide wire comprising:

a pipe made of a metal extending in the direction of the longitudinal axis thereof; and a superconducting oxide material filling the interior of said pipe and comprising superconducting oxide grains which are bonded to each other and which have a perovskite crystal structure having a C face and a C axis, wherein said superconducting oxide material is an oxide comprising: Cu; at least one element selected from the group consisting of Ba, Sr and Ca; at least one element selected from the group consisting of Y and rare earth elements; and O;

said superconducting oxide grains containing more than 60 vol % or more of plate-shaped grains of which a length in the direction of the C face is two times greater than another length in the direction of the C axis, the C faces of a majority of the plate-shaped grains being directed in parallel with the longitudinal axis of the pipe.

9. A superconducting oxide wire comprising:

a pipe made of a metal extending in the direction of the longitudinal axis thereof; and a superconducting oxide material filling the interior of said pipe and comprising superconducting oxide grains which are bonded to each other and which have a perovskite crystal structure having a C face and a C axis, wherein said superconducting oxide material is an oxide comprising: Cu; at least one element selected from the group consisting of Ba, Sr and Ca; at least one element selected from the group consisting of rare earth elements and Y; at least one element selected from the group consisting of alkali metals, bismuth, and thallium; and O; said superconducting oxide grains containing more than 60 vol % or more of plate-shaped grains of which a length in the direction of the c face is two times greater than another length in the direction of the C axis, the C faces of a majority of the plate-shaped grains being directed in parallel with the longitudinal axis of the pipe.

10. A superconducting oxide wire according to claim 2, wherein said high Tc superconducting material is an oxide comprising Cu, Ba, Y and O.

11. A superconducting oxide wire according to claim 8, wherein said high Tc superconducting material is an oxide comprising Cu, Ba, Y and O.

* * * * *

UNITED STATES PATENT AND TRADEMARK OFFICE
CERTIFICATE OF CORRECTION

PATENT NO. : 5,,093,314
DATED : March 3, 1992
INVENTOR(S) : Takahashi, et al

It is certified that error appears in the above-identified patent and that said Letters Patent is hereby corrected as shown below:

On the title page , Item [22]:
Please correct the filing date to read --1988--;

Please include the priority data

--[30]  June 26, 1987 [JP]  Japan .... 62-157691
         July 10, 1987 [JP]  Japan .... 62-171015--

Signed and Sealed this

Second Day of November, 1993

*Attest:*

BRUCE LEHMAN

*Attesting Officer*    Commissioner of Patents and Trademarks